(12) United States Patent
Varghese et al.

(10) Patent No.: US 7,079,559 B2
(45) Date of Patent: Jul. 18, 2006

(54) FLIP-CHIP AUTOMATICALLY ALIGNED OPTICAL DEVICE

(75) Inventors: Tansen Varghese, Hillsborough, NJ (US); William Ring, Ringoes, NJ (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/374,798

(22) Filed: Feb. 25, 2003

(65) Prior Publication Data
US 2004/0165634 A1    Aug. 26, 2004

(51) Int. Cl.
*H01S 5/00* (2006.01)

(52) U.S. Cl. .............................. 372/44.01; 372/43.01; 372/50.1

(58) Field of Classification Search ............. 372/43–46, 372/50, 43.01, 44.01, 45.01, 46.01, 50.1
See application file for complete search history.

(56) References Cited

U.S. PATENT DOCUMENTS

| | | | | |
|---|---|---|---|---|
| 4,867,371 A * | 9/1989 | Davis et al. | ................. | 228/160 |
| 5,402,259 A * | 3/1995 | Lembo et al. | ............... | 359/245 |
| 6,058,234 A * | 5/2000 | Tachigori | ..................... | 385/49 |
| 6,136,623 A * | 10/2000 | Hofstetter et al. | ............ | 438/28 |
| 6,278,136 B1 * | 8/2001 | Nitta | ............................ | 257/99 |
| 6,281,524 B1 * | 8/2001 | Yamamoto et al. | ........... | 257/99 |
| 6,574,379 B1 * | 6/2003 | Miyazaki | ........................ | 385/1 |
| 2002/0102043 A1 * | 8/2002 | Shin | ............................ | 385/14 |

\* cited by examiner

*Primary Examiner*—James Menefee

(57) ABSTRACT

A semiconductor laser device with a first side and a second side, comprising (a) an active region, (b) a P layer, wherein the P layer contains a first contact area, (c) an N layer, wherein said N layer contains a second contact area, wherein the contact area of the first contact area of the P layer and the second contact layer of the N layer reside on the first side of the laser device.

26 Claims, 4 Drawing Sheets

Laser with bond wires on silicon optical bench

FLIP-CHIP AUTOMATICALLY ALIGNED OPTICAL DEVICE

FIELD OF THE INVENTION

The present invention relates to semiconductor optical devices, and more specifically relates to a novel flip chip construction of a semiconductor laser.

BACKGROUND OF THE INVENTION

In recent years, considerable effort has been spent in developing low cost optical packages. Optical communication technology has increased in popularity in the data communications and telecommunications industries over the past several years. The packaging is a high cost element of producing optical devices because of the difficulties surrounding alignment and connection of optical devices and optical fibers. Alignment of laser diodes and optical fibers is a slow, labor intensive task and automation of this process is extremely difficult. As a result, the cost of using most optical packages is high.

Recently, silicon optical benches have been developed to reduce the cost involved with packaging optical circuits. A silicon optical bench is a silicon platform on which a number of optical devices can be packaged. The optical devices are manufactured in a semiconductor chip, and the chip is mounted to the silicon optical bench. Using a silicon optical bench allows several optical circuits on a plurality of chips to be packaged on a single platform or bench.

To mount a chip containing an optical circuit on a silicon optical bench requires contact to be made between the contacting areas on the chip and the bench itself. One side of an optical device chip normally comprises a P contact or an N contact surface, while the opposite side comprises a complimentary contact. The bottom side of the chip is soldered directly to the silicon optical bench to provide contact between the bench and one contacting layer. The chip is first placed on solder pads located on the optical bench, and then the solder is re-flowed to affix the chip to the bench. Contact is made to the complimentary contact layer using one or more bond wires.

FIG. 1 illustrates an optical device chip 50 mounted to a silicon optical bench 52 in accordance with the prior art. Referring to FIG. 1, contact is made between the P contact pad 54 and the silicon optical bench 52 using a solder pad 53. Contact is made to the N contact area 56 on the top of the chip using a bond wire 58 between the N contact area 56 on the top of the chip and an additional contact region located on the silicon optical bench (not shown).

Despite the advantages of using a silicon optical bench, the mounting of optical chips remains a high cost, labor intensive process. The optical chip must be actively aligned with the desired location on the silicon optical bench during the installation process. In addition, once the chip has been soldered to the silicon optical bench, the bond wires must be individually installed to make contact to the top surface of the chip. This makes automation difficult and requires expensive, high precision equipment.

In addition to manufacturing concerns, the bond wires also introduce additional parasitic parameters (e.g., capacitance, inductance) into the circuit. The bond wires also cause a higher failure rate of the circuit by providing an additional component subject to failure or defect.

Non-optical device chips have been developed that have both the P contact and the N contact residing on the same side of the device. These chips are known in the art as "flip chips." However, the fabrication of conventional flip chips requires via holes to be etched through the chip to create a contact from the top side of the chip to the bottom side of the chip. The creation of these vias add additional processing steps, which has made fabrication of optical devices in a flip chip configuration unpractical.

Accordingly, there is a need for an optical chip that can be quickly and easily mounted to a silicon optical bench without requiring bond wires or extensive alignment. The present invention fulfills this need among others.

SUMMARY OF THE INVENTION

The present invention provides for a semiconductor laser device having both the N contact area and the P contact located on the same side of the chip. Specifically, rather than having one contact area on the base of the chip connected to the optical bench while using a wire bonding technique to make contact with the second contact area located on the opposite side of the chip, the chip configuration allows both the N contact area and the P contact area to be made directly to the silicon optical bench.

In addition, the semiconductor device in accordance with the present invention is passively aligned to the optical bench upon mounting. At least one solder alignment or bond pad is formed on the base of the chip and on the optical bench. Upon mounting, the solder is reflowed, and the solder bond pads on the base of the chip align with corresponding solder pads on the silicon optical bench.

One aspect of the invention is a semiconductor laser device with a first side and a second side, comprising (a) an active region, (b) a P layer, wherein the P layer contains a first contact area, (c) an N layer, wherein said N layer contains a second contact area, wherein the contact area of the first contact area of the P layer and the second contact layer of the N layer reside on the first side of the laser device.

An additional aspect of the invention is an optical semiconductor laser device having a plurality of solder pads formed on the first side of the chip. The solder pads passively align the device to the desired location on the silicon optical bench during solder reflow.

DETAILED DESCRIPTION OF THE INVENTION

Figure 1:
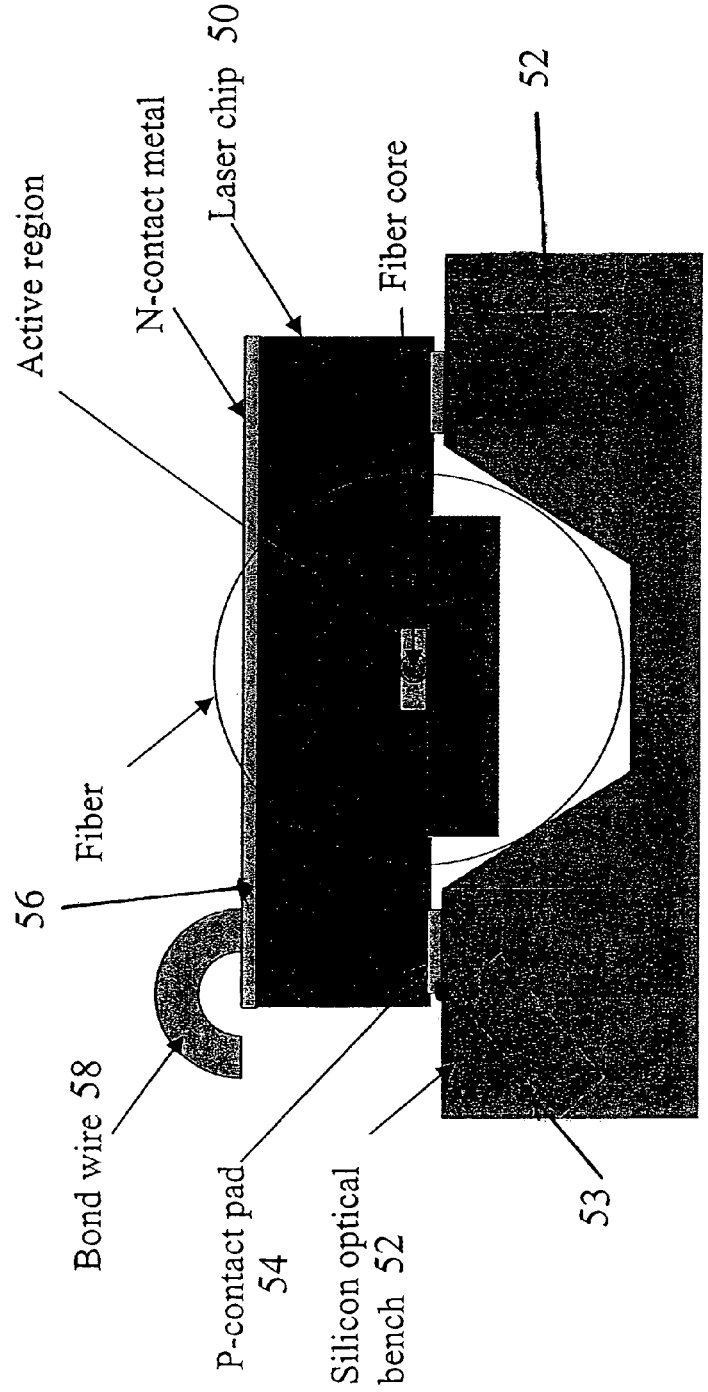
FIG. 1 is a cross-sectional view of an optical device mounted to a silicon optical bench in accordance with the prior art.
Figure 2:
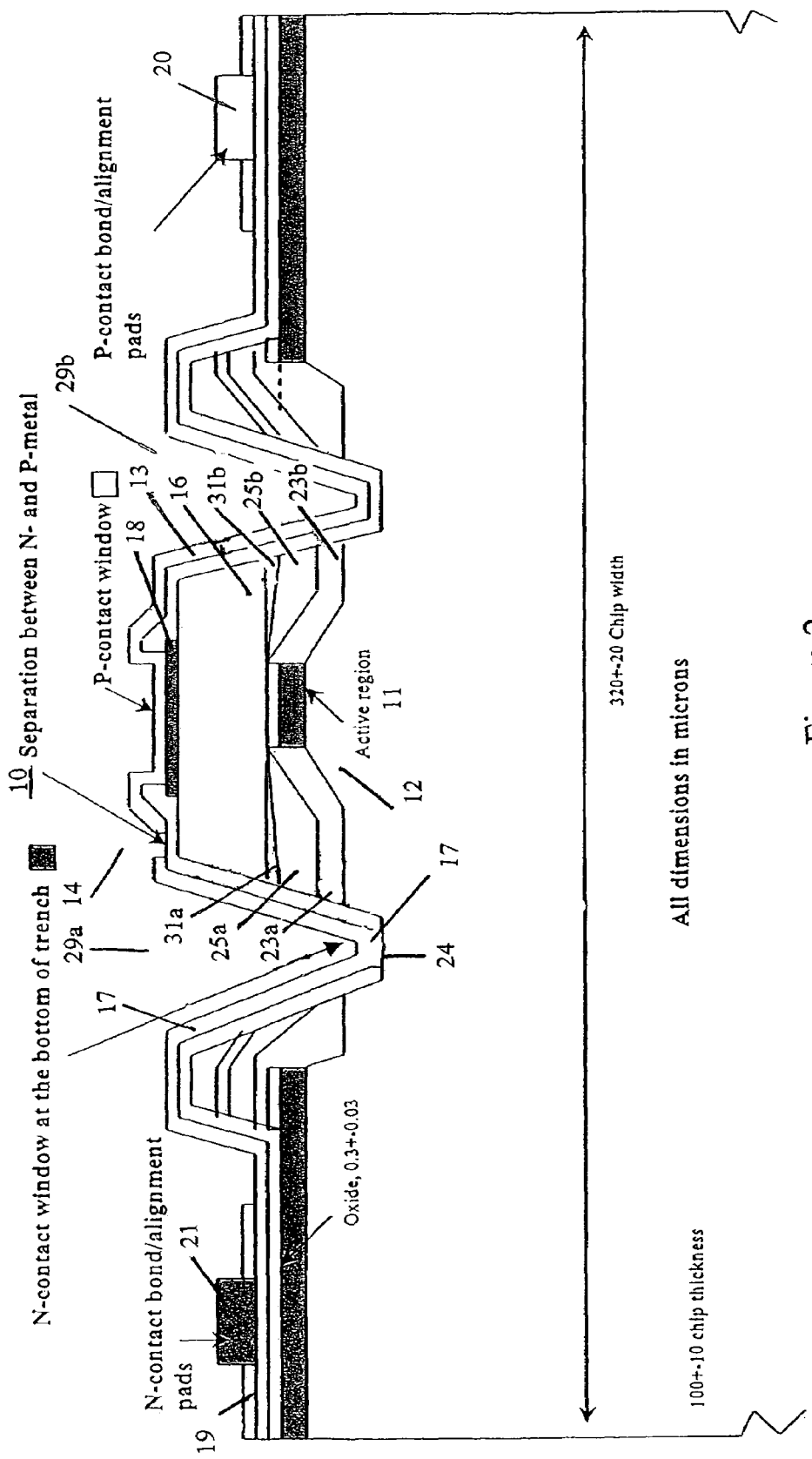
FIG. 2 is a cross-sectional view of a device in accordance with the present invention.

Referring to FIG. 2, a preferred embodiment of the semiconductor laser device 10 is shown. The illustrated device is a laser having an active region 11 for emitting light located in the horizontal center of the chip. The light emitting from the active region 11 would travel perpendicular to the cross-sectional cut of the chip as illustrated in FIG. 1 (i.e., the light would travel outward from the paper as shown in FIG. 2). However, the invention is not limited to chips containing a single active region and may be practiced with other chip configurations.

Figure 3:
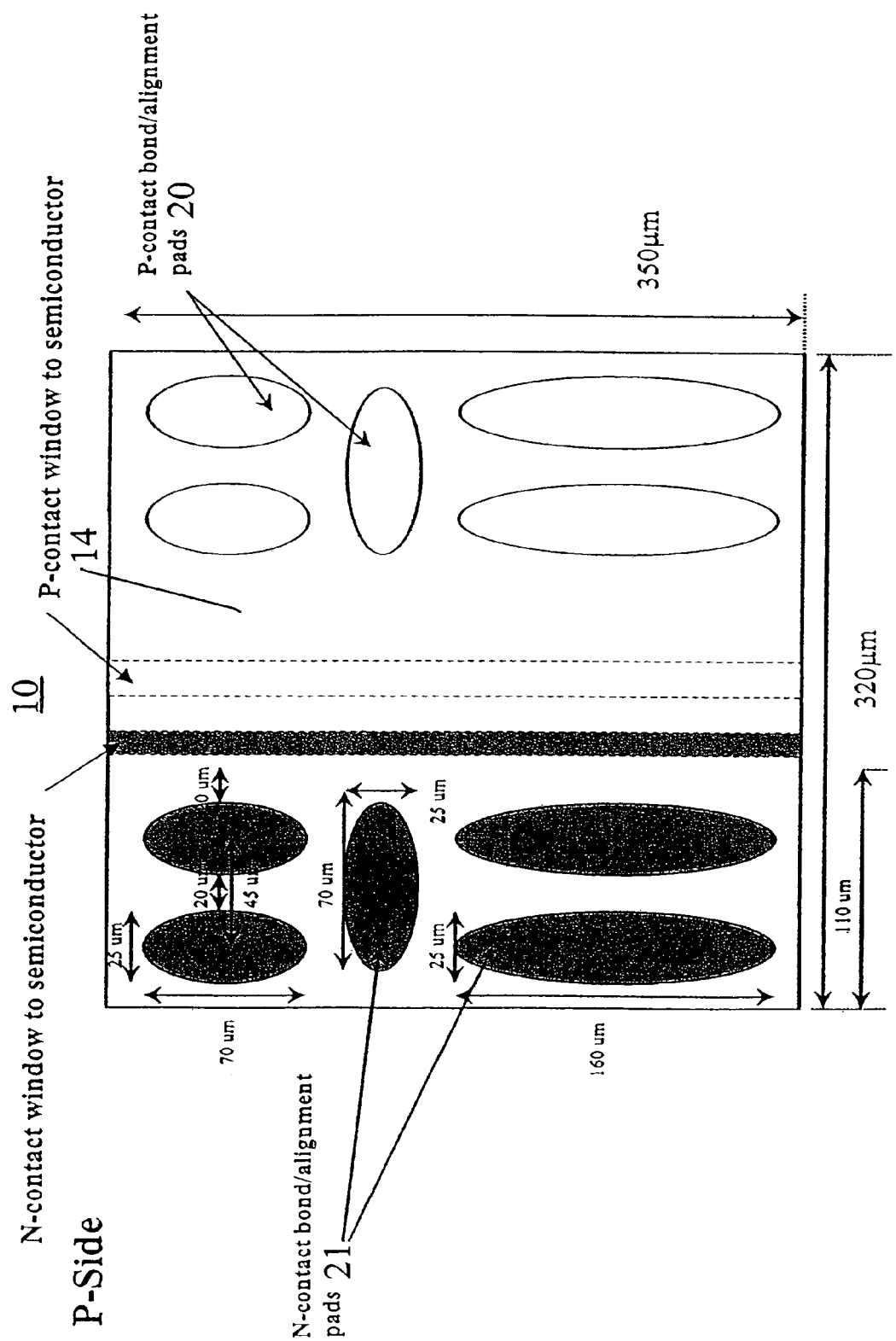
FIG. 3 is a top view of a device in accordance with the present invention.

The optical chip 10 comprises: (a) an active layer having an region 11, (b) a first portion of a metal layer, a P layer 13, having a plurality of P-contact bond pads 20, and (c) a second portion of the metal layer, an N layer 17, separated from the first portion by a gap and having a plurality of N-contact bond pads 21. The P-contact bond pads 20 and the N-contact bond pads 21 both reside on the bottom side 14 of the optical chip 10 (it should be noted that the bottom side of the optical chip 10 is the facing upwardly in FIG. 2 as FIG. 2 shows the chip prior to the "flip" installation). Referring to FIG. 2, a cross-sectional view of a single P-contact bond pad and a single N-contact bond pad is shown. FIG. 3 illustrates a plurality of P-contact and N-contact bond pads on the bottom side 14 of the chip 10.

Referring again to FIG. 2, the optical chip operates by emitting light from the active region 11. The light emits from the edge of the chip, or upwards out of the paper when viewing FIG. 2. In order to activate the active region 11, a current is applied to the P layer 13 through the P-contact bond pad 20. The P layer 13 is a metal layer disposed on top of the semiconductor material. The current flows through the P layer into a contact layer 18. The contact layer 18 is a layer of semiconductor that contacts the metal P layer 13. This layer facilitates a highly conductive, highly stable contact. In a preferred embodiment, the contact layer 18 is approximately 0.3 microns thick.

Beneath the contact layer 18 is a P-bury layer 16 approximately 2.5 microns thick. The current passes through the contact layer 18 and into the P-bury layer 16. The current travels through the P-bury layer 16 and into the active region 11. In a preferred embodiment, the active region 11 is approximately 0.25 microns thick and has a width approximately 1.6 microns.

Current blocking regions exist on either side of the active region. In the embodiment illustrated in FIG. 2, the blocking regions comprise three layers. P type block layers 23a, 23b resides above the N side 12 of the device on both sides of the active region 11. The P type blocking layers 23a, 23b are approximately 1 micron in thickness. N type blocking layers 25a, 25b that are approximately 1 micron thick at their widest point reside on top of the P type blocking layers 23a, 23b. A P-cap layer 31a, 31b is located beneath the P-bury layer 16 and the top of the N type blocking layer on either side of the active region 11. The use of blocking regions prevents the current from flowing laterally to ground and forces the current to flow through the active region. The use of blocking regions are well known in the art.

The current that travels down through the active region 11 drives the active region 11 and causes the optical device to operate by emitting laser light. While the device shown in the illustrated embodiment is a laser, other embodiments include various devices such as modulators or amplifiers.

Once the current passes through the active region 11, it flows through the N side 12 of the device to the N contact layer 17. The bulk of the device on the N-side comprises a semiconductor material, preferably any of the type III–V semiconductors. The current flows through the N side 12 of the device and enters the N contact layer 17 via an N contact window 24 defined in an oxide layer 35 and located on the inner side of the N contact layer 17 at the bottom of a trench 29a formed in the bottom of the chip 10. The N contact layer 17 is grounded by making contact through the N contact solder pads 21.

When the chip 10 is mounted on a silicon optical bench, contact to both the P layer 13 and the N layer 17 is made on the bottom or underside of the chip 10. The P contact bond pad 20 is connected to a current source on the silicon optical bench and the N contact bond pad is connected to ground on the silicon optical bench. In a preferred embodiment, connection is made using solder; however, other techniques such as conductive adhesives or other contacting methods could be used. Both contact regions are on the bottom side of the chip (i.e., the side that contacts the silicon optical bench). As a result, there is no need to contact the top side of the chip 10. Thus, the need for bond wires is eliminated. In addition, the need for bond pads or contact areas on the top side of the chip 10 also is eliminated. Furthermore, by configuring the chip 10 to locate the N contact window 24 at the bottom of the trench 29a, the need to fabricate vias in the chip 10 to allow contact to the N side 12 is eliminated.

A top view of the chip 10 is shown in FIG. 3. Referring to FIG. 3, the locations of a plurality of P contact bond pads 20 and a plurality of N contact bond pads 21 on the underside of the chip 10 for a preferred embodiment is shown. Surrounding the bond pads is a dielectric layer 19. When the chip 10 is installed on the silicon optical bench, the chip is flipped over such that the side illustrated in FIG. 3 containing the P contact bond pads 20 and N contact bond pads 21 is adjacent to the surface of the silicon optical bench. When the chip 10 is placed on the silicon optical bench, the P contact bond pads 20 and N contact bond pads 21 on the chip 10 are placed in rough alignment with corresponding contact pads on the silicon optical bench. Preferably, the P contact bond pads 20 and N contact bond pads 21 are formed out of solder. During installation, the solder is re-flowed, thus forcing the chip to move into proper alignment with the silicon optical bench as a result of the surface tension present in the solder during re-flow. Alignment is controlled by configuring the shape and location of the P contact bond pads 20 and N contact bond pads 21, as well as the composition of the solder comprising the pads. By controlling the re-flow conditions, proper alignment is assured.

Figure 4:
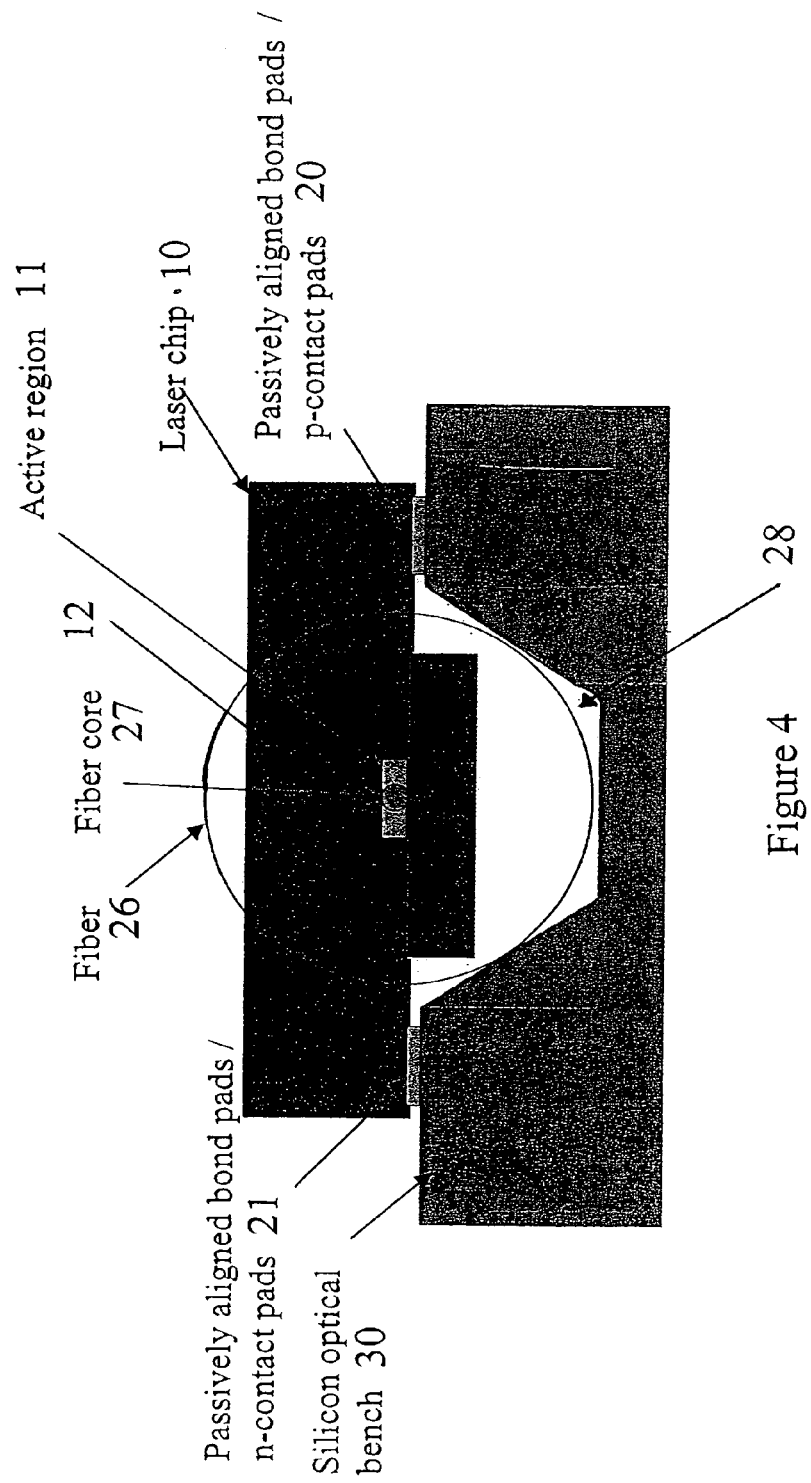
FIG. 4 is a cross-sectional view showing the device in accordance with the present invention mounted to a silicon optical bench.

FIG. 4 illustrates a chip 10 in accordance with the present invention mounted to the silicon optical bench 30. The N contact pad 21 and the P contact pad 20 are both in contact with the silicon optical bench 30. The chip is aligned such that the active region 11 is in alignment with a core region 27 of an optical fiber 26. The fiber 26 is positioned in a groove 28 on the silicon optical bench. The alignment of the chip 10 with respect to the silicon optical bench 30 and the optical fiber 26 is achieved during the reflow process. After alignment, the light emitting from the active region 11 of the chip 10 enters the core 27 of the fiber 26.

The solder forming the P contact bond pads 20 and N contact bond pads 21 is electrically conductive. This allows the creation of the necessary electrical contact between the contact areas on the chip 10 and the contact areas on the silicon optical bench.

The chip 10 in accordance with the present invention would provide several advantages over existing opto-electrical devices. Because both the N contact and the P contact reside on the underside of the chip, direct contact can be made to the silicon optical bench. The need for bond wires is eliminated, thus reducing the cost of manufacture as well as eliminating unwanted parasitic properties introduced by bond wires. In addition, removing the bond wires removes one possible failure mechanism from the final device. Furthermore, by configuring the contact areas on the underside of the device in accordance with the present invention, complicated alignment processes currently associated with the uses of optical chips on silicon optical benches are eliminated. The chip in accordance with the present invention can be easily passively aligned during the mounting of the chip to the silicon optical bench using a solder reflow technique between the P contact bond pads 20 and N contact bond pads 21 located on the underside of the device and the corresponding contact pads on the bench.

It should be understood that the foregoing is illustrative and not limiting and that obvious modifications may be made by those skilled in the art without departing from the spirit of the invention. Accordingly, the specification is intended to cover such alternatives, modifications, and equivalence as may be included within the spirit and scope of the invention as defined in the following claims.

What is claimed is:

1. An optical semiconductor device for mounting to an optical bench, said optical semiconductor device having a vertical orientation with a top side and a bottom side such that said optical semiconductor device is mounted top side down on said optical bench, said optical semiconductor device comprising:
    an active region in an active mesa;
    a P layer;
    at least one P bond pad electrically coupled to said P layer and located at a certain vertical position relative to said active region on a mesa different from said active mesa;
    an N layer; and
    at least one N bond pad electrically coupled to said N layer and located at said certain vertical position relative to said active region on a mesa different from said active mesa;
    wherein said at least one P bond pad and said at least one N bond pad reside on said top side; and
    wherein either said P layer or said N layer is above said certain vertical position.

2. The optical semiconductor device as set forth in claim 1, wherein said top side is coupled to an optical bench.

3. The optical semiconductor device as set forth in claim 1, wherein said P bond pad and said N bond pad comprise solder.

4. The optical semiconductor device as set forth in claim 1, wherein said device is a laser.

5. A method for attaching an optical semiconductor device having a vertical orientation with a top side and a bottom side to an optical bench, said method comprising:
    (a) orientating providing an optical semiconductor device having active region in an active mesa, a P layer, at least one P bond pad electrically coupled to said P layer and located at a certain vertical position relative to said active region on a mesa different from said active mesa, an N layer, and at feast one N bond pad electrically coupled to said N layer and located at said certain vertical position relative to said active region on a mesa different from said active mesa, wherein either said P layer or said N layer is above said certain vertical position;
    (b) orientating said device top side down;
    (c) placing said device on said optical bench wherein said at least one P bond pad and said at least one N bond pad are approximately aligned to said optical bench;
    (d) performing a re-flow process on said at least one P bond pad and said at least one N bond pad to create a bond between said device and said optical bench.

6. The method as set forth in claim 5, wherein said at least one P bond pad and said at least one N bond pad comprise solder.

7. The method as set forth in claim 5, wherein said device is a laser.

8. The optical semiconductor device of claim 1, wherein said P and N bond pads are located on different mesas.

9. The optical semiconductor device of claim 8, wherein said active mesa is located between a P mesa comprising said P bond pad and an N mesa comprising said N bond pad.

10. The optical semiconductor device of claim 9, wherein either said P layer or said N layer is located in said active mesa above said active region.

11. The optical semiconductor device of claim 10, wherein said P layer is located only in said active mesa above said active region.

12. The optical semiconductor device of claim 11, wherein said P layer is not disposed between said P bond pad and said N layer.

13. The optical semiconductor device of claim 9, further comprising an active layer comprising said active region and an oxide layer on said active layer and a metal layer on said oxide layer, said metal layer having a gap to isolate a first portion of said metal layer from a second portion of said metal layer, said P and N bond pads being disposed on said first and second portions of said metal layer, respectively.

14. The optical semiconductor device of claim 13, wherein said device defines a notch between said active mesa and said N mesa said notch extending into said N layer, said oxide layer defining a gap at said notch, said second portion of said metal layer occupying said gap such that said second portion of said metal layer contacts said N layer, thereby electrically coupling said N bond pad to said N layer.

15. The optical semiconductor device of claim 14, wherein said P layer is disposed over said active region in said active mesa, said oxide layer defining a window above said P layer, and said first portion of said metal layer occupying said window such that said first portion of said metal layer electrically couples said P layer with said bond pad.

16. The optical semiconductor device of claim 1, wherein said P layer is not disposed between said P bond pad and said N layer.

17. An optical semiconductor device for mourning to an optical bench, said optical semiconductor device having a vertical orientation with a top side and a bottom side such that said optical semiconductor device is mounted top side down on said optical bench, said optical semiconductor device comprising:
    an active layer;
    an active region of said active layer in an active mesa;
    a P layer;
    at least one P bond pad electrically coupled to said P layer and located at a certain vertical position relative to said active region on a mesa different from said active mesa;
    an N layer; and
    at least one N bond pad electrically coupled to said N layer and located at said certain vertical position relative to said active region on a mesa different from said active mesa:
    an oxide layer on said active layer;
    a metal layer on said oxide layer, said metal layer having a gap to isolate a first portion of said metal layer from a second portion of said metal layer, said P and N bond pads being disposed on said first and second portions of said metal layer, respectively; and
    wherein said at least one P bond pad and said at least one N bond pad reside on said top side.

18. The optical semiconductor device of claim 17, wherein said P and N bond pads are located on different mesas.

19. The optical semiconductor device of claim 18, wherein said active mesa is located between a P mesa comprising said P bond pad and an N mesa comprising said N bond pad.

20. The optical semiconductor device of claim 17, wherein either said P layer or said N layer is located in said active mesa above said active region.

21. The optical semiconductor device of claim 17, wherein either said P layer or said N layer is above said certain vertical position.

22. The optical semiconductor device of claim 17, wherein said P layer is located only in said active mesa above said active region.

23. The optical semiconductor device of claim 22, wherein said P layer is not disposed between said P bond pad and said N layer.

24. The optical semiconductor device of claim 17, wherein said device defines a notch between said active mesa and said N mesa, said notch extending into said N layer, said oxide layer defining a gap at said notch, said second portion of said metal layer occupying said gap such that said second portion of said metal layer contacts said N layer, thereby electrically coupling said N bond pad to said N layer.

25. The optical semiconductor device of claim 14, wherein said P layer is disposed over said active region in said active mesa, said oxide layer defining a window above said P layer, and said first portion of said metal layer occupying said window such that said first portion of said metal layer electrically couples said P layer with said P bond pad.

26. The optical semiconductor device of claim 17, wherein said P layer is not disposed between said P bond pad and said N layer.

* * * * *